United States Patent
Hayashibe et al.

(10) Patent No.: US 7,751,104 B2
(45) Date of Patent: Jul. 6, 2010

(54) HOLOGRAM RECORDING MEDIUM (75) Inventors: Kazuya Hayashibe, Miyagi (JP); Takao Kudo, Miyagi (JP); Yusuke Suzuki, Miyagi (JP); Masahiro Sawaguchi, Miyagi (JP)

(73) Assignee: Sony Corporation, Tokyo (JP)

( * ) Notice: Subject to any disclaimer, the term of this patent is extended or adjusted under 35 U.S.C. 154(b) by 178 days.

(21) Appl. No.: 11/711,581

(22) Filed: Feb. 27, 2007

(65) Prior Publication Data
US 2007/0206251 A1 Sep. 6, 2007

(30) Foreign Application Priority Data
Mar. 2, 2006 (JP) .............................. 2006-056184

(51) Int. Cl.
*G03H 1/02* (2006.01)
(52) U.S. Cl. ............................................. 359/3; 359/1
(58) Field of Classification Search .............. 359/3, 359/1
See application file for complete search history.

(56) References Cited

U.S. PATENT DOCUMENTS

| 5,736,228 A * | 4/1998 | Morris et al. ............ 428/195.1 |
| 6,756,157 B2 * | 6/2004 | Ohtaki et al. .................. 430/1 |
| 7,385,740 B2 * | 6/2008 | Haga et al. ..................... 359/3 |
| 2006/0280095 A1 * | 12/2006 | Tsukagoshi et al. ......... 369/103 |
| 2007/0013982 A1 * | 1/2007 | Miura et al. .................... 359/3 |

FOREIGN PATENT DOCUMENTS

| JP | 2873126 | 1/1999 |
| JP | 11-034475 | 2/1999 |
| JP | 2001-130179 A | 5/2001 |
| JP | 2003-220662 A | 8/2003 |
| JP | 2004-139104 A | 5/2004 |

* cited by examiner

*Primary Examiner*—Audrey Y Chang
(74) *Attorney, Agent, or Firm*—Wolf, Greenfield & Sacks, P.C.

(57) ABSTRACT

A hologram recording medium includes a stack of at least a lower transparent substrate, a recording layer made of a photocurable organic material, and an upper transparent substrate, wherein a spacer for keeping a thickness of the recording layer is dispersed and disposed in the inside of the recording layer in a direction of a principal plane of the hologram recording medium.

14 Claims, 5 Drawing Sheets

HOLOGRAM RECORDING MEDIUM

CROSS REFERENCES TO RELATED APPLICATIONS

The present invention contains subjects related to Japanese Patent Application JP 2006-056184 filed in the Japan Patent Office on Mar. 2, 2006, the entire contents of which being incorporated herein by reference.

BACKGROUND OF THE INVENTION

1. Field of the Invention

The invention relates to a hologram recording medium which displays a three-dimensional image by a hologram.

2. Description of the Related Art

A three-dimensional image by a hologram is applied for three-dimensional image recording media for decorative purposes or in the security field of credit cards or ID cards. Of such hologram recording media for image display applications, small-sized hologram recording media have been put into practical use in credit cards or the like; and in recent years, for decorative purposes or advertising purposes or purposes of displaying detailed information in maps or the like, hologram recording media having a larger size are being desired.

Also, in structures of image display media (hologram recording media) by a hologram system, a structure in which a recording layer which is a photosensitive substance is interposed between substrates such as transparent films or glass thin plates is general. As this recording method, there is advocated a method of writing information by refractive index modulation of a major component of the recording layer by a light source with high coherence such as lasers from both planes or one plane of the hologram recording medium (see, for example, Japanese Patent No. 2873126 (Patent Document 1)). According to this Patent Document 1 or the like, two lights having an equal wavelength (namely, object light and reference light) are interfered to generate a wave surface as an interference fringe, and a photoreactive monomer which is a photosensitive material is polymerized and fixed thereon, whereby information is recorded due to a difference in refractive index or transmittivity from other sites. When the original reference light is irradiated thereon, a wave surface the same as in the object light can be reproduced by a diffraction phenomenon.

For the purpose of achieving recording by increasing the screen size of a hologram recording medium, countermeasures such as use of an exposure light source with high intensity and prolongation of an exposure time are general. However, in this method, since the size of device becomes large and a long time is taken, there was involved a problem that the costs increase.

SUMMARY OF THE INVENTION

In view of the foregoing problems of the related art, it is desirable to provide a hologram recording medium in which an exposure time can be shortened as compared with the related art, unevenness in thickness of a recording layer is inhibited and reliability of a recording region is improved.

According to an embodiment of the invention, there is provided a hologram recording medium including a stack of at least a lower transparent substrate, a recording layer made of a photocurable organic material, and an upper transparent substrate, wherein a spacer for keeping a thickness of the recording layer is dispersed and disposed in the inside of the recording layer in a direction of a principal plane of the hologram recording medium.

Here, it is preferable that the spacer is a fine particle. Alternatively, the spacer may be a projection provided on a surface of the lower transparent substrate and/or the upper transparent substrate.

Also, it is suitable that an area occupation rate of the spacer in a region of the principal plane of the recording layer is not more than 13%.

Also, it is preferable that the spacer is at least transparent against light which is used during recording or reproduction of the hologram recording medium and that a difference in refractive index between the spacer and the recording layer falls within 20%. Furthermore, it is better that the spacer has a scattering of length in a thickness direction of the recording layer falling within 10%.

Also, it is suitable that each of the lower substrate and the upper substrate is made of a polycarbonate or polyethylene terephthalate.

According to the embodiment of the invention, even by using a substrate which is flexible and easy to change in shape, unevenness in thickness or a change with time of the recording layer becomes small, and stable image display becomes possible. Also, since a film substrate which is easy to apply shape processing can be used, it becomes possible to increase an area as the hologram recording medium. Furthermore, even when a constitutional material of the recording layer is a soft material with fluidity, it is possible to prepare a hologram recording medium, and therefore, choice of the constitutional material of the recording layer is expanded. In particular, since a constitutional material with high sensitivity can be used, the quantity of light at the exposure may be minimized, and the recording time can be shortened.

Also, it is possible to not only prevent deterioration with time of the recording layer but also keep a good recording characteristic.

DETAILED DESCRIPTION OF THE PREFERRED EMBODIMENTS

In devising to realize a large screen size of a hologram recording medium, the present inventors took into consideration the following requirements.

(1) Substrate:

In increasing the screen size of the hologram recording medium, a material which does not absorb wavelength components necessary for recording or reproduction and which is transparent in a visible light region and smooth for the purpose of recognizing an image on at least one surface thereof is needed for the substrate. In view of use applications, a material, a shape of which can be relatively easily changed and which can be installed on a curved surface and rounded in storing as in films, is desirable. In this case, a poly-carbonate (PC), polyethylene terephthalate (PET), or the like is especially preferable.

(2) Constitutional Material of Recording Layer:

So far as the constitutional material of the recording layer of the hologram recording medium is a material with high sensitivity in which a reaction proceeds even at a slight exposure amount, a power of exposure light source may be minimized, and shortening of exposure time and cost reduction can be realized. In particular, such a material is important for a hologram recording medium of large screen size. For the purpose of improving the sensitivity of such a recording layer, it is desirable that the material has such a characteristic that it is easy to occur in the movement of a monomer as the constitutional material and is soft.

From these reasons, in many cases, the recording layer is in a state of liquid, gel or sol and is easy to cause fluidization. Accordingly, in the hologram recording medium, unevenness in thickness or a change in thickness with time of the recording layer occurs, and the deterioration of an image to be recorded and displayed is of a problem. This is an especially important problem because in a hologram recording medium with a large screen size, it is required to use a transparent, large and flexible plastic substrate as described previously.

Then, the present inventors made extensive and intensive investigations regarding a technology capable of stabilizing a recording layer having even a large area and stably protecting and fixing a constitutional material before and after a reaction of the recording layer. They also investigated a method capable of not only solving unevenness in thickness, a problem of wettability and a problem of repellence or air bubbles in drying and fixation when the recording layer is formed by coating, printing, spraying or the like, but also relieving or preventing a change in physical properties of the constitutional material from the time of preparation until after recording, leading to accomplishment of the invention.

A configuration of the hologram recording medium according to an embodiment of the invention is hereunder described.

The hologram recording medium according to an embodiment of the invention includes a stack of at least a lower transparent substrate, a recording layer made of a photocurable organic material, and an upper transparent substrate, wherein a spacer for keeping a thickness of the recording layer is dispersed and disposed in the inside of the recording layer in a direction of a principal plane of the hologram recording medium.

Figure 1:
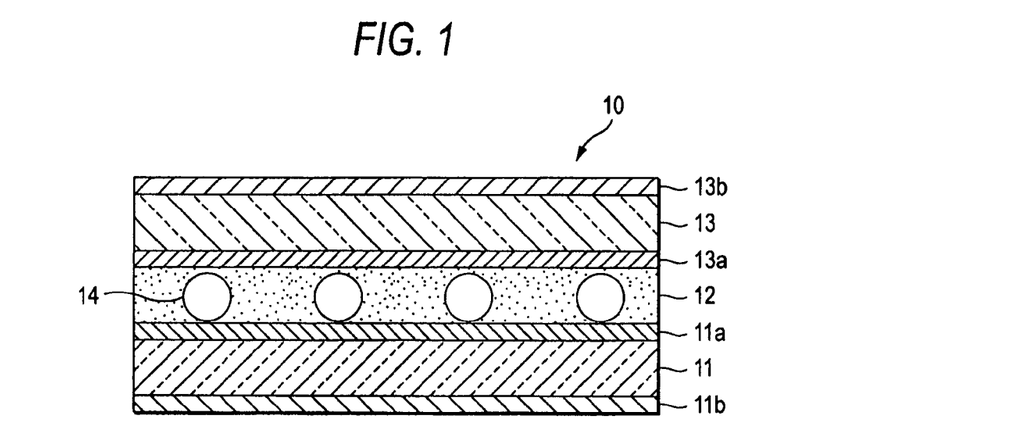
FIG. 1 is a sectional view to show a configuration of a first embodiment of a hologram recording medium according to an embodiment of the invention.

FIG. 1 shows a configuration of a first embodiment of a hologram recording medium according to an embodiment of the invention.

As illustrated in FIG. 1, a hologram recording medium 10 is a stack of a lower transparent substrate 11, a recording layer 12 made of a photocurable organic material, and an upper transparent substrate 13; and a fine particle 14 which is one embodiment of a spacer for keeping a thickness of the recording layer 12 is dispersed and disposed in the inside of the recording layer 12 in a direction of a principal plane of the hologram recording medium 10. Also, the lower transparent substrate 11 is provided with a first protective layer 11a for preventing the recording layer 12 from being deteriorated on a surface thereof in a side facing on the recording layer 12 and provided with a second protective layer 11b for preventing the lower transparent substrate 11 from being damaged on a surface thereof in an opposite side to the recording layer 12. Also, the upper transparent substrate 13 is provided with a first protective layer 13a for preventing the recording layer 12 from being deteriorated on a surface thereof in a side facing on the recording layer 12 and provided with a second protective layer 13b for preventing the upper transparent substrate 13 from being damaged on a surface thereof in an opposite side to the recording layer 12.

Here, known transparent materials having a thin thickness can be used for each of the lower transparent substrate 11 and the upper transparent substrate 13, and examples thereof include polymers such as polyesters, polyurethanes, vinyl polymers, acrylic polymers, and styrene polymers or mixtures thereof and glass materials. It is preferable that each of the lower transparent substrate 11 and the upper transparent substrate 13 has a flexible thin-layer structure (film). Polycarbonate based resin films having a small birefringence utilizing a method for reducing a birefringence during the film manufacture and polyethylene terephthalate resin films having good chemical resistance are especially preferable. Taking into consideration easiness of shape processing, the thickness is desirably 10 μm or more and not more than 1 mm.

For the photocurable organic material constituting the recording layer 12, volume hologram material compositions such as general photocurable organic materials and silver salt emulsions can be used. Combinations containing, as a major component of the photocurable organic material, a photoreactive resin (monomer), a sensitizing dye, a curing agent and a reaction initiator and, as a minor component, other photoreactive resin, a heat reactive resin, en electron beam curable resin, a filling resin, a plasticizer, a defoaming agent, a thickener, and the like can be freely used.

For the photoreactive resin, photoreactive resins which are general as the volume hologram material composition can be widely used, and for example, one or more kinds of radical polymerizable compounds such as acrylamide, styrene, and phenyl acrylate can be used. Also, when a cation polymerizable compound is used together, the fixation of the residual monomer or filler after photopolymerization of the radical polymerizable compound can be expected.

Also, a reaction initiator and a sensitizing dye can be used for photo radical polymerization in an embodiment according to the invention. As the reaction initiator, for example, general compounds such as peroxides, azo compounds, ketones, diazoaminobenzenes, diaryl iodonium salts, triazines, metal complex salts, and dyes can be used. For the sensitizing dye, cyanine based dyes which become transparent after the reaction are desirable in view of the application of an embodiment according to the invention. Incidentally, in the case where the cation polymerizable compound is used together with the photoreactive resin, it is better to use a reaction initiator for photo cation polymerization together. Examples of the reaction initiator which can be used include diaryl iodonium salts, triaryl sulfonium salts, and metal complexes.

In this recording layer 12, the recording of a hologram is achieved due to the generation of a change in refractive index. That is, a photosensitive agent such as a reaction initiator or a sensitizing dye which is sensitive to a desired wavelength is blended in the material of the recording layer 12 such that a wavelength region of light to which the recording layer 12 is sensitive can be changed to a desired specific wavelength, and when light having a specific wavelength region is irradiated, a photocuring reaction is initiated. Also, at that time, the blended reaction initiator or sensitizing dye or the like changes in transmittivity at that wavelength corresponding to the quantity of irradiated light. Incidentally, with the respect to the wavelength to which the recording layer 12 is sensitive, it is desired to choose the reaction initiator or sensitizing dye or the like while avoiding a wavelength at which an action such as absorption takes places in the lower transparent substrate 11 or the upper transparent substrate 13, and a visible light wavelength is preferable.

The thickness of the recording layer 12 can be arbitrarily set up on a basis of the use purpose or sensitivity of the constitutional material or the like. Taking into consideration a refractive index modulation degree of the general photocurable organic material, for the purpose of displaying an image, the thickness of the recording layer 12 is preferably 10 μm or more and not more than 100 μm. Also, a plurality of the recording layer 12 may be provided as the need arises.

The fine particle 14 is of a substrate supporting structure in which it is contained in a dispersed state in the recording layer 12 and has an average particle size of 1 μm or more and not more than the thickness of the recording layer 12. Also, as the material of the fine particle 14, metal oxides, nitrides or carbides, resins, carbon nanotubes, and the like can be used. Examples thereof include synthetic resins (for example, acrylic resins, polystyrene, polyethylene, and poly-carbonates), BK7, quartz, PYREX (a registered trademark), magnesium oxide, calcium fluoride, aluminum oxide, titanium oxide, potassium titanate, zirconium oxide, zinc sulfide, and white lead.

The shape of the fine particle 14 can be arbitrarily chosen among shapes including from an amorphous shape to a spherical shape. Alternatively, the shape may be an aggregate (secondary agglomerate) shape or an internally hollow shape. Also, a mixture of these various shapes may be utilized.

Also, for the dispersing or strengthening purpose by an interface, a general dispersant or coupling agent may be added, thereby surface treating, surface coating or carrying the fine particle 14.

Incidentally, it is preferable that an area occupation rate of the fine particle 14 in a region of the principal plane (display screen region) of the recording layer 12 is not more than 13%. This is because though the intensity (signal amount) of diffracted light at the reproduction of the recording layer 12 is reduced due to the presence of the fine particle 14, when this area occupation ratio is not more than 13%, a reduction of the signal amount is suppressed to about 15%, and the deterioration of the image quality of display image falls within a tolerable range. Incidentally, even when the area occupation rate of the fine particle 14 is 0.1%, the effects of an embodiment according to the invention are obtainable.

In the case where the fine particle 14 is at least transparent to light used in the recording or reproduction of the hologram recording medium, it is preferable that a difference in refractive index between the fine particle 14 and the recording layer 12 (photocurable organic material) falls within 20%.

This is because when the difference in refractive index between the fine particle 14 (refractive index: n1) and the recording layer 12 (refractive index: n2) is not more than 20%, even in the both cases of (n1>n2) and (n2>n1), according to the following Fresnel reflection formula, a reflectance R of light reflected by the fine particle 14 is not more than about 1% and its influence is negligible.

$$R = |(n2-n1)/(n1+n2)|^2 \quad (1)$$

As a material which can be used for the fine particle 14 which is satisfied with such a refractive index, for example, in the case where the refractive index of the recording layer 12 is 1.53 (wavelength: 532 nm), a material having a refractive index of from 1.22 to 1.84 is corresponding thereto; and examples thereof include synthetic resins (for example, acrylic resins, polystyrene, polyethylene, and poly-carbonates) and glass materials (for example, BK7, quartz, PYREX (a registered trademark), magnesium oxide, calcium fluoride, and aluminum oxide).

Also, it is preferable that a scattering in length of the fine particle 14 in a thickness direction of the recording layer 12 falls within 10%. In this way, unevenness in thickness or a change with time of the recording layer 12 can be sufficiently inhibited.

Also, it is desirable that the fine particle 14 is uniformly dispersed in the recording layer 12 as far as possible without causing a problem that it partially gets distorted and gathers.

An organic filler having a spherical shape and having a refractive index of about 1.5 is especially preferable as the foregoing fine particle 14. Specific examples of the organic filler which can be suitably used include "TECHPOLYMER" manufactured by Sekisui Plastics Co., Ltd., "SUBMICRON FILLER" manufactured by Nippon Kasei Chemical Co., Ltd., "CHEMISNOW" manufactured by Soken Chemical & Engineering Co., Ltd., and "EPOSTAR" manufactured by Nippon Shokubai Co., Ltd.

The first protective layers 11a and 13a are each a protective layer aiming to achieve chemical resistance and wet proofing. Examples of a material constituting these first protective layers 11a and 13a include ethylene-vinyl alcohol copolymer resins (EVOH), $SiO_2$, $Si_3N_4$, polyvinyl alcohol (PVA), and acrylic hard coat agents.

The second protective layers 11b and 13b are each a protective layer aiming to prevent the hologram recording medium 10 from being damaged due to scratches or the like. For example, there is enumerated an acrylic hard coat agent prepared by coating a solution containing an acrylic monomer, an inorganic or organic polymer, a photopolymerization initiator and an additive for adjusting a surface tension on a substrate and curing it with ultraviolet light.

According to the hologram recording medium 10 having the foregoing configuration, even by using the lower transparent substrate 11 and the upper transparent substrate 13 each of which is flexible and easy to change in shape, unevenness in thickness or a change with time of the recording layer 12 becomes small, and stable image display becomes possible. Also, since a film substrate which is easy to apply shape processing can be used, it becomes possible to realize a large area of, for example, an A0 size (841 mm long×1,189 mm across) as the hologram recording medium. Furthermore, even when a constitutional material of the recording layer 12 is a soft material with fluidity, it is possible to prepare a hologram recording medium. In particular, since a constitutional material with high sensitivity can be used, the quantity of light at the exposure may be minimized, and the recording time can be shortened.

Figure 2:
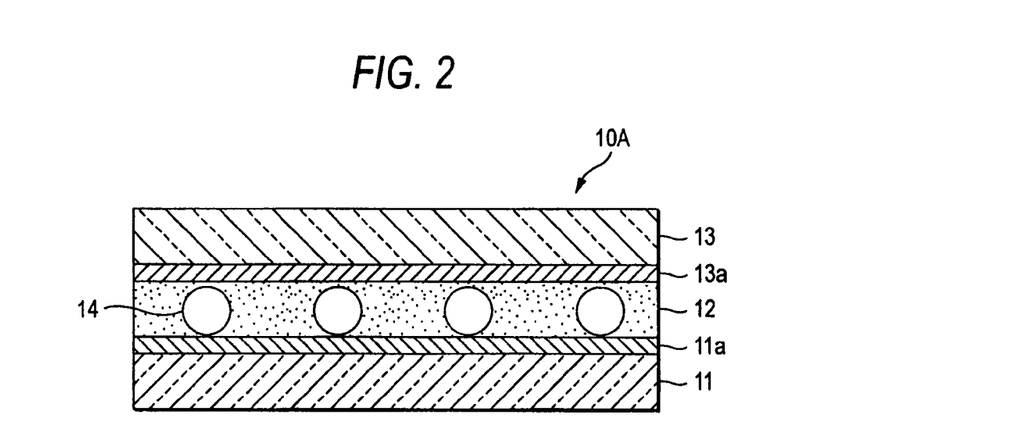
FIG. 2 is a sectional view to show a variation configuration (1) of the first embodiment of the hologram recording medium according to an embodiment of the invention.
Figure 3:
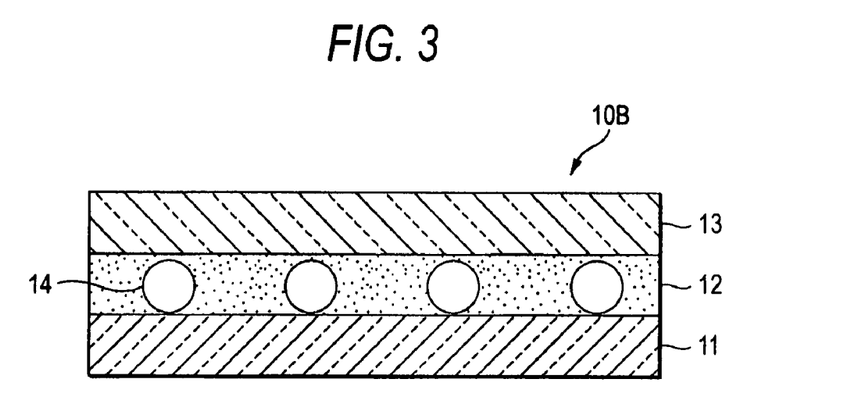
FIG. 3 is a sectional view to show a variation configuration (2) of the first embodiment of the hologram recording medium according to an embodiment of the invention.

Also, there are configurations as illustrated in FIGS. 2 and 3 as variations of the hologram recording medium of the first embodiment.

That is, a hologram recording medium 10A as illustrated in FIG. 2 is configured such that the second protective layers 11b and 13b in FIG. 1 are omitted. Also, a hologram recording medium 10B as illustrated in FIG. 3 is configured such that the first protective layers 11a and 13a and the second protective layers 11b and 13b in FIG. 1 are omitted. In all of the hologram recording media of these configurations, the effects of an embodiment according to the invention are obtained likewise the foregoing hologram recording medium 10.

Here, the hologram recording medium 10 of the first embodiment is, for example, manufactured in the following manner.

(S11) First of all, the first protective layers 11a and 13a are formed on one of principal planes of the lower transparent substrate 11 and the upper transparent substrate 13, respectively; and subsequently, the second protective layers 11b and 13b are formed on opposite planes to the planes on which the first protective layers 11a and 13a are formed, respectively.

(S12) Next, a layer (recording layer 12) made of a photocurable organic material having the fine particle 14 dispersed therein is provided on the first protective layer 11a of the lower transparent substrate 11. In detail, a mixture of a solution of a photocurable organic material dissolved in a solvent and the fine particle 14 is coated on the first protective layer 11a of the lower transparent substrate 11 by using a bar coater or by spin coating, spraying or the like, and the solvent is then volatilized by a heat treatment, thereby forming the recording layer 12. On that occasion, measures for imparting functions, adjusting the solubility and enhancing the surface energy necessary only at the formation of the recording layer may be properly applied to the first protective layer 11a.

(S13) Subsequently, the upper transparent substrate 13 is stuck on an exposed surface of the recording layer 12. Concretely, the first protective layer 13a of the upper transparent substrate 13 is brought into contact with the exposed surface of the recording layer 12 and subjected to a lamination treatment.

(S14) Subsequently, edges of the subjects (namely, the second protective layer 11b, the lower transparent substrate 11, the first protective layer 11a, the recording layer 12, the first protective layer 13a, the upper transparent substrate 13, and the second protective layer 13b) are cut, thereby completing the hologram recording medium 10 having prescribed dimensions.

Figure 4:
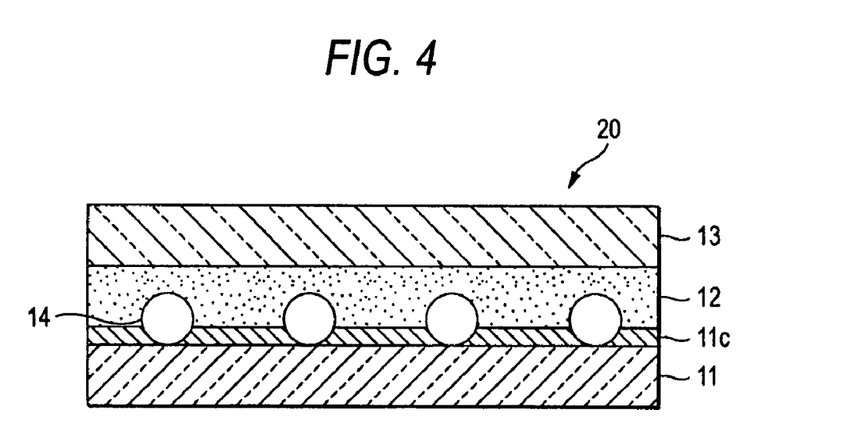
FIG. 4 is a sectional view to show a configuration of a second embodiment of a hologram recording medium according to an embodiment of the invention.

FIG. 4 shows a second embodiment of the hologram recording medium according to an embodiment of the invention.

As illustrated in FIG. 4, a hologram recording medium 20 is a stack of a lower transparent substrate 11, a recording layer 12 made of a photocurable organic material, and an upper transparent substrate 13; and a projection which is one embodiment of a spacer for keeping a thickness of the recording layer 12 is dispersed and disposed in a direction of a principal plane of the hologram recording medium 20. In detail, a fine particle 14 becomes a projection in a state that it is fixed to an adhesive layer 11c of the lower transparent substrate 11, is dispersed and disposed in a direction of a principal plane of the hologram recording medium 20 and functions as a substrate supporting structure.

In the configuration of the hologram recording medium 20, the lower transparent substrate 11, the recording layer 12, the upper transparent substrate 13 and the fine particle 14 are the same as those shown in the first embodiment (the configuration of the hologram recording medium 10), and the second embodiment is different from the first embodiment with respect to a point that the adhesive layer 11c is provided.

The adhesive layer 11c is a resin layer for fixing the fine particle 14 in a dispersed state onto the lower transparent substrate 11. In detail, the adhesive layer 11c is obtained by coating a solution of the fine particle 14 dispersed in an adhesive solution having a solubility parameter largely different from the fine particle 14 (for example, an acrylic resin and an organic solvent) on the lower transparent substrate 11 and drying it. Also, after the formation by coating and drying, a part or the whole of this adhesive layer 11c may disappear. Here, in the case where the whole of the adhesive layer 11c disappears, only the fine particle 14 is present on the lower transparent substrate 11, whereby the configuration of the second embodiment becomes the configuration of the first embodiment (for example, one as illustrated in FIG. 3).

Also, this adhesive layer 11c may be provided with a protective function for the purpose of avoiding a mutual reaction between the lower transparent substrate 11 and the recording layer 12.

Alternatively, the adhesive layer 11c may be configured in a state such that it is formed of the same components as in the lower transparent substrate 11 and that a part of the fine particle 14 is embedded in the lower transparent substrate 11.

Likewise the hologram recording medium 10, according to the hologram recording medium 20 having the foregoing configuration, even by using the lower transparent substrate 11 and the upper transparent substrate 13 each of which is flexible and easy to change in shape, unevenness in thickness or a change with time of the recording layer 12 becomes small, and stable image display becomes possible. Also, since a film substrate which is easy to apply shape processing can be used, it becomes possible to realize a large area of, for example, an A0 size (841 mm long×1,189 mm across) as the hologram recording medium. Furthermore, even when a constitutional material of the recording layer 12 is a soft material with fluidity, it is possible to prepare a hologram recording medium. In particular, since a constitutional material with high sensitivity can be used, the quantity of light at the exposure may be minimized, and the recording time can be shortened.

Figure 5:
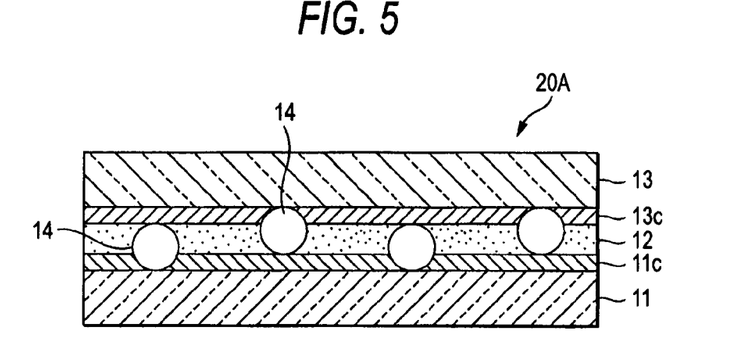
FIG. 5 is a sectional view to show a variation configuration (1) of the second embodiment of the hologram recording medium according to an embodiment of the invention.
Figure 6:
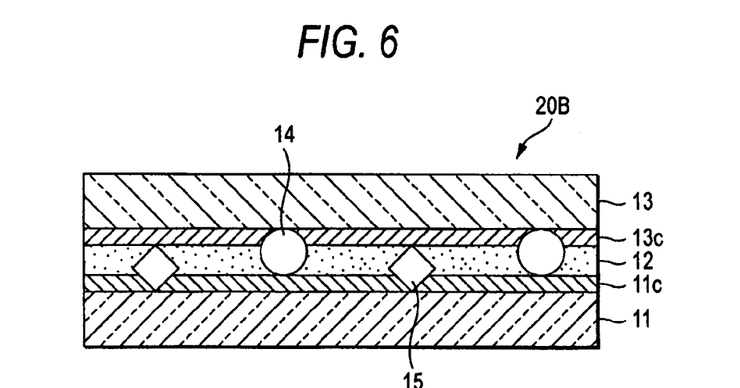
FIG. 6 is a sectional view to show a variation configuration (2) of the second embodiment of the hologram recording medium according to an embodiment of the invention.

Also, there are configurations as illustrated in FIGS. 5 and 6 as variations of the hologram recording medium of the second embodiment.

That is, a hologram recording medium 20A as illustrated in FIG. 5 is configured such that in addition to the configuration of the hologram recording medium 20 as illustrated in FIG. 4, an adhesive layer 13c the same as the adhesive layer 11c is provided on a principal plane of the upper transparent substrate 13 in the side of the recording layer 12 and that the fine particle 14 is dispersed and disposed in a direction of a principal plane of the hologram recording medium 20A in a state that it is fixed by the adhesive layer 13c. Also, a hologram recording medium 20B as illustrated in FIG. 6 is provided with a fine particle 15 which is of a different kind from the fine particle 14 while meeting the requirements of the foregoing fine particle 14 in place of the fine particle 14 on the lower transparent substrate 11 in the hologram recording medium 20A as illustrated in FIG. 5. In all of the hologram recording media of these configurations, the effects of an embodiment according to the invention are obtained likewise the foregoing hologram recording medium 20.

Here, the hologram recording medium 20 of the second embodiment is, for example, manufactured in the following manner.

(S21) First of all, a solution of the fine particle 14 dispersed in an adhesive solution having a solubility parameter largely different from the fine particle 14 (for example, an acrylic resin and an organic solvent) is coated on the lower transparent substrate 11 and then dried, thereby fixing the fine particle 14 onto the lower transparent substrate 11 by the adhesive layer 11c in a state that it is dispersed and disposed therein.

(S22) Next, a layer (recording layer 12) made of a photocurable organic material is provided on a surface of the lower transparent substrate 11 on which the fine particle 14 is fixed. In detail, a solution of a photocurable organic material dissolved in a solvent is coated on a surface of the lower transparent substrate 11 on which the fine particle 14 is fixed by using a bar coater or by spin coating, spraying or the like, and the solvent is then volatilized by a heat treatment, thereby forming the recording layer 12.

(S23) Subsequently, the upper transparent substrate 13 is stuck on an exposed surface of the recording layer 12. Concretely, a principal plane of the upper transparent substrate 13 is brought into contact with the exposed surface of the recording layer 12 and subjected to a lamination treatment.

(S24) Subsequently, edges of the subjects (namely, the lower transparent substrate 11, the adhesive layer 11c, the recording layer 12 and the upper transparent substrate 13) are cut, thereby completing the hologram recording medium 20 having prescribed dimensions.

Figure 7:
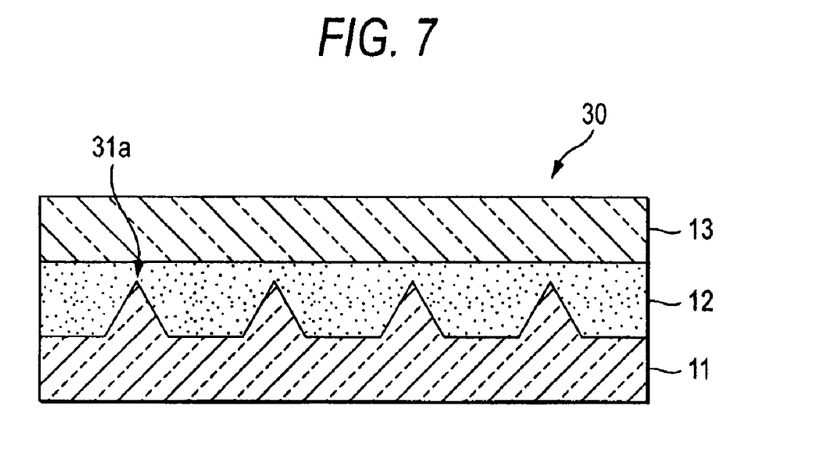
FIG. 7 is a sectional view to show a configuration of a third embodiment of a hologram recording medium according to an embodiment of the invention.

FIG. 7 shows a third embodiment of the hologram recording medium according to an embodiment of the invention.

As illustrated in FIG. 7, a hologram recording medium 30 is a stack of a lower transparent substrate 11, a recording layer 12 made of a photocurable organic material, and an upper transparent substrate 13; and a projection which is one embodiment of a spacer for keeping a thickness of the recording layer 12 is dispersed and disposed in a direction of a principal plane of the hologram recording medium 30 within recording layer 12. In detail, a projection 31a resulting from concave-convex processing of a surface of the lower transparent substrate 11 is dispersed and disposed in a direction of a principal plane of the hologram recording medium 30 and functions as a substrate supporting structure.

In the configuration of the hologram recording medium 30, the recording layer 12 and the upper transparent substrate 13 are the same as those shown in the first embodiment (the configuration of the hologram recording medium 10), and the third embodiment is different from the first embodiment with respect to a point that the lower transparent substrate 11 has the projection 31a.

The projection 31a is resulted from concave-convex processing of a surface of the lower transparent substrate 11 and is in a conical, pyramidical, columnar or prismatic form. Its average projection height is 1 μm or more and not more than the thickness of the recording layer 12; and its bottom size is 1 μm or more and not more than the thickness of the recording layer 12 in terms of one side or diameter. FIG. 7 illustrates an example wherein the projection 31a is in a conical or pyramidical form.

Also, the projection 31a is formed by physical cutting, surface processing by discharging, etc., embossing, or the like against the lower transparent substrate 11. Alternatively, from the viewpoint of activating the surface of the lower transparent substrate 11, the projection 31a may be provided by crystal growth of an inorganic or organic material by a PVD method or a CVD method, addition polymerization, or crystal formation of a saturated solution.

Incidentally, the requirements which the projection 31a is desired as the hologram recording medium conform to the requirements of the fine particle 14 in the first embodiment.

That is, it is preferable that an area occupation rate of the projection 31a (bottom) in a region of the principal plane (display screen region) of the recording layer 12 is not more than 13%. This is because though the intensity (signal amount) of diffracted light at the reproduction of the recording layer 12 is reduced due to the presence of the projection 31a, when this area occupation ratio is not more than 13%, a reduction of the signal amount is suppressed to about 15%, and the deterioration of the image quality of display image falls within a tolerable range. Incidentally, even when the area occupation rate of the projection 31a is 0.1%, the effects of an embodiment according to the invention are obtainable.

Also, it is preferable that a difference in refractive index between the projection 31a and the recording layer 12 (photocurable organic material) falls within 20%. Furthermore, it is preferable that a scattering in length (projection height) of the projection 31a in a thickness direction of the recording layer 12 falls within 10%. Moreover, it is desirable that the projection 31a is uniformly dispersed in the recording layer 12 as far as possible without causing a problem that it partially gets distorted and gathers.

Likewise the hologram recording medium 10, according to the hologram recording medium 30 having the foregoing configuration, even by using the lower transparent substrate 11 and the upper transparent substrate 13 each of which is flexible and easy to change in shape, unevenness in thickness or a change with time of the recording layer 12 becomes small, and stable image display becomes possible. Also, since a film substrate which is easy to apply shape processing can be used, it becomes possible to realize a large area of, for example, an A0 size (841 mm long×1,189 mm across) as the hologram recording medium. Furthermore, even when a constitutional material of the recording layer 12 is a soft material with fluidity, it is possible to prepare a hologram recording medium. In particular, since a constitutional material with high sensitivity can be used, the quantity of light at the exposure may be minimized, and the recording time can be shortened.

Figure 8:
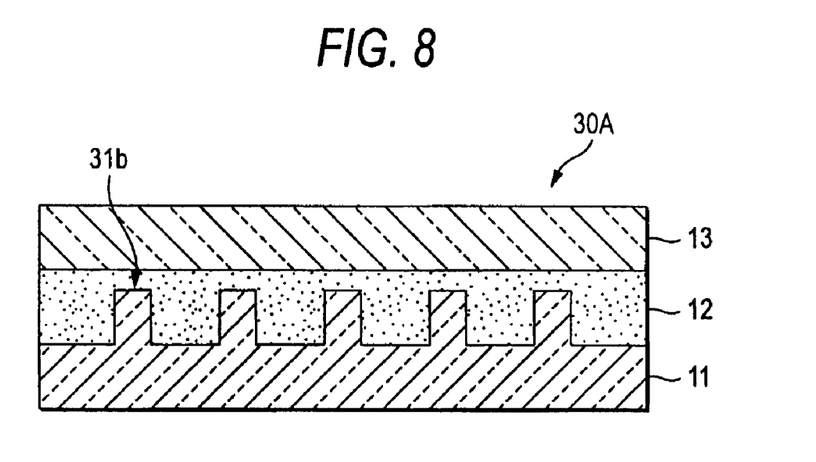
FIG. 8 is a sectional view to show a variation configuration of the third embodiment of the hologram recording medium according to an embodiment of the invention.

Also, there is a configuration as illustrated in FIG. 8 as a variation of the hologram recording medium of the third embodiment.

That is, a hologram recording medium 30A as illustrated in FIG. 8 is an example wherein in the configuration of the hologram recording medium 30 as illustrated in FIG. 7, the projection 31a in a conical or pyramidical form is replaced by a projection 31b in a columnar or prismatic form. Furthermore, such a projection 31a or 31b may be provided on a surface of the upper transparent substrate 13 in the side of the recording layer 12.

Here, the hologram recording medium 30 of the third embodiment is, for example, manufactured in the following manner.

(S31) First of all, with respect to the lower transparent substrate 11, the projection 31a is formed by physical cutting or the like.

(S32) Next, a layer (recording layer 12) made of a photocurable organic material is provided on a surface of the lower transparent substrate 11 on which the projection 31a is formed. In detail, a solution of a photocurable organic material dissolved in a solvent is coated on a surface of the lower transparent substrate 11 on which the projection 31a is formed by using a bar coater or by spin coating, spraying or the like, and the solvent is then volatilized by a heat treatment, thereby forming the recording layer 12.

(S33) Subsequently, the upper transparent substrate 13 is stuck on an exposed surface of the recording layer 12. Concretely, a principal plane of the upper transparent substrate 13 is brought into contact with the exposed surface of the recording layer 12 and subjected to a lamination treatment.

(S34) Subsequently, edges of the subjects (namely, the lower transparent substrate 11, the recording layer 12 and the upper transparent substrate 13) are cut, thereby completing the hologram recording medium 30 having prescribed dimensions.

In the foregoing hologram recording media according to the embodiments of the invention, a stereo hologram is recorded by using a prescribed exposure optical system.

Figure 9:
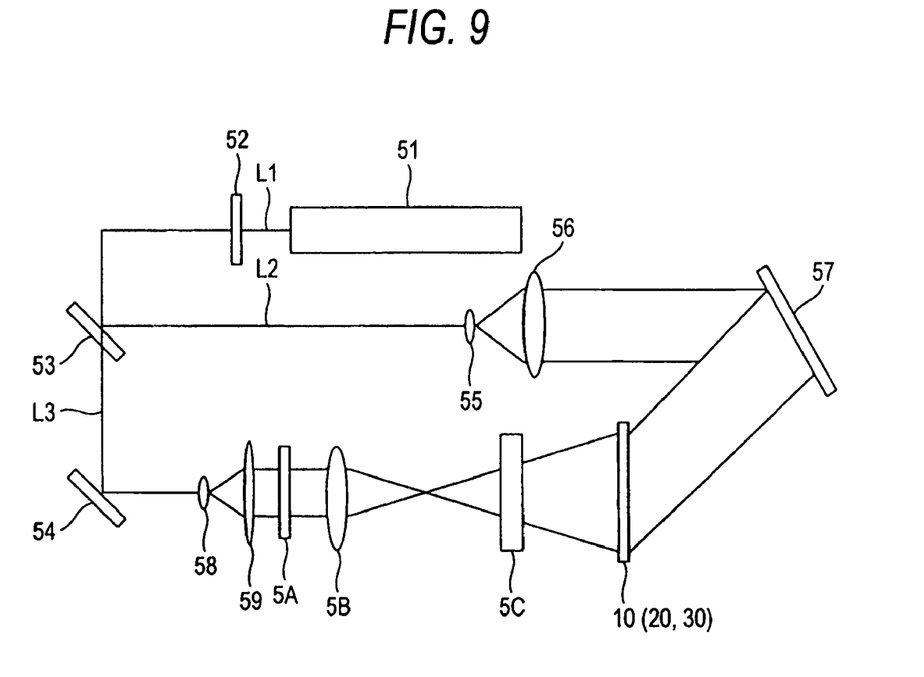
FIG. 9 is an outline view to show a configuration example of an exposure optical system of a hologram recording medium.

FIG. 9 shows an example of the exposure optical system.

As illustrated in FIG. 9, the exposure optical system is provided with a laser light source 51 for outputting laser light having a prescribed wavelength, a shutter 52 disposed on an optical axis of laser light L1 from the laser light source 51, and a half mirror 53.

The shutter 52 is controlled by a control computer (not illustrated) and is closed when not exposing the hologram recording medium 10 (or 20 or 30) but opened when exposing the hologram recording medium 10 (or 20 or 30). Alternatively, when a light source capable of outputting stable laser light immediately after the start-up, such as a semiconductor laser is used as the laser light source 51, the laser light source 51 per se may be taken on or taken off without using the shutter 52.

The half mirror 53 separates the laser light L1 which has passed through the shutter 52 into reference light and object light; light L2 reflected by the half mirror 53 becomes the reference light, whereas light L3 which has passed through the half mirror 53 becomes the object light.

A cylindrical lens 55, a collimator lens 56 for converting the reference light into parallel light, and a total reflection mirror 57 for reflecting the parallel light which has come from the collimator lens 56 are respectively disposed as an optical system for reference light on an optical axis of the light L2 reflected by the half mirror 53.

The light L2 reflected by the half mirror 53 is first converted into divergent light by the cylindrical lens 55 and then converted into parallel light by the collimator lens 56. Thereafter, the parallel light is reflected by the total reflection mirror 57 and then made incident into the hologram recording medium 10 (or 20 or 30).

On the other hand, a total reflection mirror 54 for reflecting transmitted light from the half mirror 53, a space filter 58 made of a combination of a convex lens and a pinhole, a collimator lens 59 for converting the object light into parallel light, an image display unit 5A for displaying an image of a recording object, which is, for example, made of a transmission type liquid crystal panel, a projection lens 5B for projecting the object light on the hologram recording medium 10 (or 20 or 30), and a cylindrical lens 5c for condensing the object light on the hologram recording medium 10 (or 20 or 30) are respectively disposed as an optical system for object light on an optical axis of the light L3 which has transmitted through the half mirror 53.

The light L3 which has transmitted through the half mirror 53 is reflected by the total reflection mirror 54 and then converted into diffused light from a point light source by the space filter 58. Next, the diffused light is converted into parallel light by the collimator lens 59 and then made incident into the image display unit 5A. Here, the image display unit 5A displays an image computed on a basis of the stereogram principle. The light which has been modulated by the image display unit 5A goes through the projection lens 5B, passes through the cylindrical lens 5C and is then irradiated on the hologram recording medium 10 (or 20 or 30).

Here, the reference light and the object light are regulated in such a manner that the reference light is made incident into one of the principal planes of the hologram recording medium 10 (or 20 or 30), whereas the object light is made incident into the other principal plane of the hologram recording medium 10 (or 20 or 30). That is, not only the reference light is made incident at a prescribed incident angle into one of the principal planes of the hologram recording medium 10 (or 20 or 30), but also the object light is made incident into the other principal plane of the hologram recording medium 10 (or 20 or 30) such that the optical axis of the object light is substantially vertical to the hologram recording medium 10 (or 20 or 30). In this way, the reference light and the object light interfere with each other on the recording layer 12 of the hologram recording medium 10 (or 20 or 30), and an interference fringe generated due to the interference between the reference light and the object light is exposed on the recording layer 12 and recorded as a change in refractive index.

Also, a hologram in a line state is recorded on the hologram recording medium 10 (or 20 or 30) against one coma of an image taken in the image display unit 5A. In order to prepare one holograph photograph, it is necessary to successively expose plural images prepared by computation processing in the image display unit 5A on the hologram recording medium 10 (or 20 or 30). Accordingly, a position of the hologram recording medium 10 (or 20 or 30) is shifted by one line every time when each image is displayed in the image display unit 5A, thereby preparing a hologram photograph having a desired size.

Incidentally, the recording method is not limited to the foregoing exposure of a stereo hologram, but various methods such as general image holography (see Junpei Tsujiuchi, *Holography*, published by Shokabo Publishing Co., Ltd.) and computer generated holography can be employed.

The foregoing hologram recording media according to the embodiments of the invention can be used in, for example, three-dimensional displays, optical devices of a diffraction lattice or an interference filter, memory materials, and advertising media.

EXAMPLES

Examples of actually preparing hologram recording media according to the embodiments of the invention are shown below.

Example 1

A sample of the hologram recording medium 10 of the configuration as illustrated in FIG. 1 was prepared under the following condition.

(S41) First of all, a polycarbonate film having a thickness of 100 μm was prepared for each of the lower transparent substrate 11 and the upper transparent substrate 13; and a solution containing an acrylic monomer, an inorganic or organic polymer, a photopolymerization initiator and an additive for adjusting a surface tension was coated on one of principal planes of each polycarbonate film and cured by ultraviolet light to form an acrylic hard coat agent layer. There were thus prepared the first protective layers 11a and 13a. Also, the surface of each of the lower transparent substrate 11 and the upper transparent substrate 13 opposite to the surface on which each of the protective layers 11a and 13a was formed was subjected to the same processing. There were thus formed the second protective layers 11b and 13b.

(S42) Next, a crosslinked acrylic particle (fine particle 14) having a refractive index of 1.5 and an average particle size of 30 μm, which had been subjected to antiswelling processing, was prepared ((1) 10 parts by weight, (2) 5 parts by weight, (3) 1 part by weight, (4) 0.05 parts by weight, and (5) 0 part by weight). Each of the crosslinked acrylic particles was mixed with 100 parts by weight of a solution prepared by adding a radical polymerizable monomer or cation polymerization monomer recording material as a photopolymerization material in a methyl isobutyl ketone solvent and stirred. There were thus prepared dispersion solutions.

Each of the foregoing dispersion solutions was coated at a coverage after drying of 40 cm³ per cm² on the first protective layer 11a of the lower transparent substrate 11 by a squeeze method; and the solvent was vaporized in a weight ratio of 50% by drying at normal temperature, thereby providing a layer (recording layer 12) made of a photocurable organic material (refractive index: 1.53) and having the fine particle 14 dispersed therein.

(S43) Subsequently, the first protective layer 13a of the upper transparent substrate 13 was brought into contact with the exposed surface of the recording layer 12 and subjected to a lamination treatment to achieve sticking.

(S44) Subsequently, edges of the subjects (namely, the second protective layer 11b, the lower transparent substrate 11, the first protective layer 11a, the recording layer 12, the first protective layer 13a, the upper transparent substrate 13, and the second protective layer 13b) were cut, thereby completing a sample of the hologram recording medium 10 having a size of 5 cm in square and having a thickness of the recording layer 12 of 30 μm.

Incidentally, a sample of (1) 10 parts by weight of the fine particle 14, a sample of (2) 5 parts by weight of the fine particle 14, a sample of (3) 1 part by weight of the fine particle 14, a sample of (4) 0.05 parts by weight of the fine particle 14 and a sample of (5) 0 part by weight of the fine particle 14 were designated as Example 1-1, Example 1-2, Example 1-3, Example 1-4 and Comparative Example 1, respectively. At that time, the area occupation rate of the fine particle 14 in the sample was 13% in Example 1-1, 7% in Example 1-2, 1.6% in Example 1-3, 0.1% in Example 1-4 and 0% in Comparative Example 1, respectively.

With respect to the thus obtained samples, the following evaluation tests were carried out.

(1) Stability Test A of Recording Layer:

Each of the foregoing samples was placed in a thermostat oven at 60° C. for 24 hours, and the confirmation of a wetting state of the material from the edge part of the medium was performed by microscopic observation. At that time, the case where no wetting is observed was evaluated to be good (symbol: ○), and the case where wetting is observed was evaluated to be poor (symbol: X).

(2) Stability Test B of Recording Layer:

Each of the foregoing samples was sandwiched by flat acrylic plates; a load of 400 kg/m² was applied 150 h; and the generation of unevenness in thickness and the confirmation of a wetting state of the material from the edge part of the medium were visually observed. At that time, the case where no wetting is observed was evaluated to be good (symbol: ○), and the case where wetting is observed was evaluated to be poor (symbol: X).

(3) Signal Characteristic Test after Exposure:

Each of the foregoing samples was irradiated by a laser light source of SHG CW laser of Nd:YAG (wavelength: 532 nm) in an accumulated exposure amount of 10 mj/cm² in the exposure optical system as illustrated in FIG. 9, thereby measuring a diffraction efficiency of each of the samples. At that time, the case where the diffraction efficiency is 80% or more was evaluated to be good.

The thus obtained evaluation results are shown in Table 1.

TABLE 1

| | Area occupation rate of fine particle | Stability test A of recording layer | Stability test B of recording layer | Signal characteristic test after exposure |
|---|---|---|---|---|
| Example 1-1 | 13% | ○ | ○ | 80% |
| Example 1-2 | 7% | ○ | ○ | 90% |
| Example 1-3 | 1.6% | ○ | ○ | 95% |
| Example 1-4 | 0.1% | ○ | ○ | 95% |
| Comparative Example 1 | 0% | X | X | 95% |

Example 2

A sample of the hologram recording medium 10B of the configuration as illustrated in FIG. 3 was prepared under the following condition.

(S51) First of all, a PET film having a thickness of 100 μm as the lower transparent substrate 11 and a polycarbonate film having a thickness of 100 μm as the upper transparent substrate 13 were prepared, respectively.

(S52) Next, a crosslinked acrylic particle (fine particle 14) having a refractive index of 1.5 and an average particle size of 30 μm, which had been subjected to antiswelling processing, was prepared ((1) 10 parts by weight, (2) 5 parts by weight, (3) 1 part by weight, and (4) 0 part by weight). Each of the crosslinked acrylic particles was mixed with 100 parts by weight of a solution prepared by adding a radical polymerizable monomer or cation polymerization monomer recording material as a photopolymerization material in a methyl isobutyl ketone solvent and stirred. There were thus prepared dispersion solutions.

Each of the foregoing dispersion solutions was coated at a coverage after drying of 40 cm³ per m² on the lower transparent substrate 11 by a squeeze method; and the solvent was vaporized in a weight ratio of 50% by drying at normal temperature, thereby providing a layer (recording layer 12) made of a photocurable organic material (refractive index: 1.53) and having the fine particle 14 dispersed therein.

(S53) Subsequently, the upper transparent substrate 13 was brought into contact with the exposed surface of the recording layer 12 and subjected to a lamination treatment to achieve sticking.

(S54) Subsequently, edges of the subjects (namely, the lower transparent substrate 11, the recording layer 12, and the upper transparent substrate 13) were cut, thereby completing a sample of the hologram recording medium 10B having a size of 5 cm in square and having a thickness of the recording layer 12 of 30 μm.

Incidentally, a sample of (1) 10 parts by weight of the fine particle 14, a sample of (2) 5 parts by weight of the fine particle 14, a sample of (3) 1 part by weight of the fine particle 14 and a sample of (5) 0 part by weight of the fine particle 14 were designated as Example 2-1, Example 2-2, Example 2-3 and Comparative Example 2, respectively. At that time, the area occupation rate of the fine particle 14 in the sample was 13% in Example 2-1, 7% in Example 2-2, 1.6% in Example 2-3 and 0% in Comparative Example 2, respectively.

With respect to the thus obtained samples, the same evaluation tests as in Example 1 were carried out.

The thus obtained evaluation results are shown in Table 2.

TABLE 2

|  | Area occupation rate of fine particle | Stability test A of recording layer | Stability test B of recording layer | Signal characteristic test after exposure |
|---|---|---|---|---|
| Example 2-1 | 13% | ○ | ○ | 80% |
| Example 2-2 | 7% | ○ | ○ | 90% |
| Example 2-3 | 1.6% | ○ | ○ | 95% |
| Comparative Example 2 | 0% | X | X | 95% |

It should be understood by those skilled in the art that various modifications, combinations, sub-combinations and alternations may occur depending on design requirements and other factors insofar as they are within the scope of the appended claims or the equivalents thereof.

What is claimed is:

1. A hologram recording medium comprising:
   a stack of at least one lower transparent substrate,
   a recording layer made of a photocurable organic material,
   a protective layer disposed immediately adjacent to the recording layer,
   an upper transparent substrate,
   a spacer for keeping a thickness of the recording layer being dispersed and disposed on the inside of the recording layer in a direction of a principal plane of the hologram recording medium, wherein the thickness of the recording layer ranges between about 10 microns and below 100 microns, and an occupation area of the spacer in a region of the principal plane of the recording layer is not more than 13% of a total occupation area of the recording layer.

2. The hologram recording medium according to claim 1, wherein the spacer includes at least one fine particle.

3. The hologram recording medium according to claim 2, wherein the at least one fine particle comprises a plurality of fine particles having different shapes.

4. The hologram recording medium according to claim 1, wherein the spacer is a projection provided on a surface of at least one of the lower transparent substrate or the upper transparent substrate, the projection being disposed in a direction facing the recording layer.

5. The hologram recording medium according to claim 4, wherein the projection is in at least one of a conical or pyramidal form.

6. The hologram recording medium according to claim 4, wherein an average projection height of a plurality of projections ranges between about 1 micron and about 100 microns.

7. The hologram recording medium according to claim 4, wherein the projection is provided by crystal growth of an inorganic or organic material.

8. The hologram recording medium according to claim 1, wherein the spacer is at least transparent against light which is used during recording or reproduction of the hologram recording medium, and
   a difference in refractive index between the spacer and the recording layer is within 20%.

9. The hologram recording medium according to claim 1, wherein the spacer has a scattering in length in a thickness direction of the recording layer that ranges within 10%.

10. The hologram recording medium according to claim 1, wherein each of the lower substrate and the upper substrate is made of a polyethylene terephthalate.

11. The hologram recording medium according to claim 1, wherein the protective layer disposed immediately adjacent to the recording layer comprises an adhesive layer.

12. The hologram recording medium according to claim 11, wherein the spacer is fixed to the adhesive layer in a dispersed state.

13. The hologram recording medium according to claim 1, further comprising a second protective layer disposed immediately adjacent to the recording layer.

14. The hologram recording medium according to claim 13, wherein the second protective layer disposed immediately adjacent to the recording layer comprises an adhesive layer.

* * * * *